(12) United States Patent
Wagner et al.

(10) Patent No.: US 10,396,510 B1
(45) Date of Patent: Aug. 27, 2019

(54) COAXIAL CONNECTOR WITH COMPENSATOR

(71) Applicant: HUBER + SUHNER AG, Herisau (CH)

(72) Inventors: Martin Wagner, Steinach (CH); Haris Beganovic, Wittenbach (CH); Jürg Nussbaumer, Arnegg (CH)

(73) Assignee: HUBER + SUHNER AG, Herisau (CH)

( * ) Notice: Subject to any disclaimer, the term of this patent is extended or adjusted under 35 U.S.C. 154(b) by 0 days.

(21) Appl. No.: 16/023,745

(22) Filed: Jun. 29, 2018

(51) Int. Cl.
*H01R 24/50* (2011.01)
*H01R 9/05* (2006.01)
*H01R 13/24* (2006.01)
*H01R 13/17* (2006.01)
*H01R 4/64* (2006.01)
*H01R 12/70* (2011.01)
*H01R 4/48* (2006.01)
*H01R 12/71* (2011.01)

(52) U.S. Cl.
CPC ............. *H01R 24/50* (2013.01); *H01R 4/643* (2013.01); *H01R 9/0515* (2013.01); *H01R 12/7082* (2013.01); *H01R 13/17* (2013.01); *H01R 13/2492* (2013.01); *H01R 4/48* (2013.01); *H01R 12/714* (2013.01)

(58) Field of Classification Search
CPC .. H01R 24/50; H01R 12/7082; H01R 12/714; H01R 4/643; H01R 4/48; H01R 9/0515; H01R 13/17; H01R 13/2492
USPC ........................................................ 439/578
See application file for complete search history.

(56) References Cited

U.S. PATENT DOCUMENTS

| | | | | |
|---|---|---|---|---|
| 4,740,746 A | * | 4/1988 | Pollock .............. | G01R 1/06722 324/72.5 |
| 5,409,398 A | * | 4/1995 | Chadbourne ........ | H01R 13/717 439/488 |
| 5,477,159 A | * | 12/1995 | Hamling ............ | G01R 1/06772 324/755.02 |
| 6,053,777 A | * | 4/2000 | Boyle ...................... | G01R 1/06 439/482 |
| 6,699,054 B1 | * | 3/2004 | Critelli ............... | H01R 13/6315 439/248 |

(Continued)

FOREIGN PATENT DOCUMENTS

| | | |
|---|---|---|
| WO | WO 2013/072011 A1 | 5/2013 |
| WO | WO 2016/020190 A1 | 2/2016 |
| WO | WO 2017/125314 A1 | 7/2017 |

*Primary Examiner* — Harshad C Patel
(74) *Attorney, Agent, or Firm* — Pauley Erickson & Kottis

(57) ABSTRACT

A coaxial connector includes a connector front end connectable with a circuit board and a connector rear end connectable with a coaxial cable. An outer conductor arrangement connectable with an outer conductor of a coaxial cable at the connector rear end, which has a compensator means arranged at the connector front end and has at least one cup spring having a contacting zone configured to contact a contact face of a circuit board to establish an electrical interconnection between the outer conductor arrangement and the contact face. The cup spring has a center aperture that is at least partially encircled by the contacting zone. An inner conductor arrangement includes a contacting tip configured to contact a contacting point of a circuit board via the center aperture of the compensator means to establish an electrical contact between the inner conductor and the contacting point.

23 Claims, 5 Drawing Sheets

(56) References Cited

U.S. PATENT DOCUMENTS

| | | | |
|---|---|---|---|
| 7,972,173 B1* | 7/2011 | Hyzin | H01R 13/2421 439/578 |
| 9,130,328 B1* | 9/2015 | Huang | H01R 13/2421 |
| 10,069,257 B1* | 9/2018 | Soubh | H01R 24/40 |
| 2008/0003852 A1* | 1/2008 | Xu | H01R 13/2421 439/131 |
| 2011/0161050 A1* | 6/2011 | Montena | H01R 13/641 702/188 |
| 2013/0330944 A1* | 12/2013 | Rucki | H01R 12/714 439/81 |

* cited by examiner

COAXIAL CONNECTOR WITH COMPENSATOR

BACKGROUND OF THE INVENTION

Field of the Invention

The present invention relates to a coaxial connector for electrically interconnecting a coaxial cable with a circuit board, as well as to a connector assembly comprising such a coaxial connector and to a contact arrangement comprising such a coaxial connector.

Discussion of Related Art

US2013/0330944A1 was published on Dec. 12, 2013 on behalf of Andrew LLC and discloses an electronic device with a spring-loaded blind-mate electrical interconnect to be blindly mated with a printed circuit board (PCB). The electronic device comprises a housing and at least one RF interconnect. The RF interconnect comprises an outer conductor, an insulator, and an inner conductor that function in a manner similar to the outer conductor, insulator, and inner conductor of a coaxial cable, respectively. The inner conductor comprises a spring-loaded electrical contact such as a POGO pin. An upper end of the outer conductor is electrically coupled to the housing and a lower end of the outer conductor is configured to electrically couple to a ground return path of the printed circuit board. In its normally extended position, the spring-loaded contact extends beyond the lower end of the outer conductor, and the outer conductor limits the compression distance of the spring-loaded contact. With such a device, proper electrical contact between the outer conductor and the ground return path of the PCB can only be ensured if the outer conductor as well as the PCB have very low tolerances as well as the electronic device is precisely aligned with respect to the PCB. This may lead to cross-talk as well as it may limit bandwidth.

WO2013/072011 was published on 23 May 2013 on behalf of Rosenberger Hochfrequenztechnik GmbH & Co. KG and discloses a connecting member by which radio-frequency signals can be transmitted between two printed circuit boards. The connecting member comprises a tubular sheath, which has at least one opening for reducing the axial stiffness in order to obtain a compensation for tolerances on the positions of the two circuit boards to be connected. The outer conductor comprises a first conductor with a tubular shell with two ends provided for contacting the two circuit boards and at least one opening to reduce axial stiffness for balancing the tolerance with regard to the distance of the two circuit boards. The outer conductor also comprises, as well as the first conductor, a second conductor which is likewise of a tubular form, the first conductor being in electrically conductive contact with the second conductor, which electrically conductive contact is also axially mobile in relation to a portion of the first conductor, the second conductor being solidly connected to the first conductor over a portion. Such a connecting member can only be used for establishing direct connection between two circuit boards that are arranged at a certain distance apart from each other and essentially in parallel to each other. As well, depending on different parameters resonance phenomena between the first and the second conductor can have a negative effect on signal quality.

WO2016/020190 A1 was published on 11 Feb. 2016 on behalf of Siemens Aktiengesellschaft and discloses an electrical contact assembly that comprises a contact-establishing device having a deformable contact segment. The elastically deformable contact segment disclosed is provided for contacting two coaxial conductors.

WO2017/125314 A1 was published on 27 Jul. 2017 on behalf of the applicant of the application at hand and discloses a connector assembly that comprises a first connector having a housing which holds at least one jack assembly with an inner conductor and an outer conductor arranged coaxial to the inner conductor. The connector assembly further comprises a second connector having a socket with at least one opening extending in an axial direction. The opening comprises a contact surface which in a mated position is electrically interconnected to an outer conductor of the jack assembly. In direction of the axial extension of the opening a contact surface is arranged which in the mated position is electrically interconnected to the inner conductor of the first connector part. Such a connector assembly allows to obtain high quality connection between coaxial cables and a circuit board. However, for certain applications such a connector assembly comprising a first and a second connector to be arranged on a circuit board may not be optimal.

SUMMARY OF THE INVENTION

In order to connect coaxial cables to circuit boards, such as printed circuit boards (aka PCB), several types of connector assemblies are known. Most of these assemblies comprise a first member to be permanently interconnected mechanically and electrically with at least one coaxial cable and a second member to be permanently interconnected mechanically and electrically with the circuit board, typically by a solder connection. Although such connections typically offer high quality signal transmission, they have certain drawbacks. As such, in chip development establishing of such permanent connector members on circuit boards is relatively complex and expensive. As well as connecting such members to a circuit board typically also has a negative effect on the mechanical characteristics of the circuit board. This in particular holds true if multiple cables have to be interconnected to a circuit board.

Different types of probes are known which have been designed to contact specific contacting points or conductive traces on a circuit board. However, in order to obtain high quality transmission of signals such probe-type coaxial connectors typically require very precise positioning and angular alignment of the probe and the circuit board relatively to each other. In addition, in many cases it is required that the probe must be applied to the circuit board with a significant mechanical force in order to obtain a proper electrical contact between the outer conductor and the contact face of the circuit board to ensure sufficient shielding of the inner conductor. Such shielding is necessary in order to avoid cross talk. If the circuit board's contact face has a certain asperity (respectively is uneven) and/or precise angular alignment is not feasible, obtaining proper contact may become impossible or may lead to mechanical damaging of the circuit board to supercritical load stresses. This in particular holds true if multiple probes have to be positioned and aligned at the same time.

In order to solve at least one of the herein mentioned problems, according to the present invention a coaxial connector for electrically interconnecting a coaxial cable with a circuit board typically comprises a connector front end to be interconnected with a circuit board and a connector rear end to be interconnected with the coaxial cable. According to the invention the coaxial connector comprises an outer conductor arrangement to be interconnected with an outer conductor of a coaxial cable at the connector rear end. The outer conductor arrangement comprises a compensator means that is arranged at the connector front end and has at least one cup spring which comprises a contacting zone configured to contact a contact face of a circuit board to establish an electrical interconnection between the outer conductor arrangement and the contact face. The cup spring comprises a center aperture that is at least partially encircled by the contacting zone. The coaxial connector further comprises an inner conductor arrangement to be interconnected with an inner conductor of a coaxial cable at the connector rear end and which has a contacting tip that is configured to contact a contacting point of a circuit board via the center aperture of the compensator means to establish an electrical contact between the inner conductor and the contacting point.

Thus, a coaxial connector according to the present invention allows to establish a sufficiently shielded electrical connection between a circuit board and a coaxial cable without the need for a socket or similar member arranged on a circuit board and without the risk of inducing mechanical damage to the circuit board. In addition the total force as well as local stress acting on the circuit board can be reduced and/or limited.

Thus, an electrical contact between the inner conductor arrangement and a contacting point of a circuit board can be established and at the same time a high quality contact of the outer conductor with a contact face of the circuit board can be obtained, without the need of any special receiving/ mating connector part integrated to the circuit board. The inner conductor arrangement may also be the inner conductor of the cable or partially be the inner conductor of the cable.

According to a variation of the invention, the cup spring is configured such that the contacting zone can be deflected in a direction essentially perpendicular to the contact face of the circuit board when the contact face of a circuit board is contacted. Due to such a deflection, an electrical contact that essentially extends all around the inner conductor can be established between the outer conductor and the contact face of a circuit board. This allows to obtain high quality shielding. The resulting connection allows to obtain a predictable (somehow predefined) ground contact, which makes higher bandwidth possible. This in particular holds true if the contacting zone is divided into multiple segments which may be deflectable essentially independently from each other and hence allow to compensate asperity of the circuit board's surface as well as minor misalignments of the coaxial connector relatively to the circuit board, as will be explained in more detail below.

Good results may be obtained if the connector has an elongated shape (e.g. a cylindrical shape) wherein the contacting zone can be deflected essentially in parallel to a longitudinal axis that extends from the connector front end to the connector rear end. A particularly good signal transmission as well as contacting of a circuit board can be obtained if the cup spring has an essentially circular cross section.

A particularly cost-effective variation of a connector may be obtained if the cup spring is attached to, and electrically interconnected with, a mounting body arranged at the connector front end. Thus, assembly of the connector can be simplified.

Particularly good results may be obtained of the cup spring has an essentially frustoconical shape which allows proper deformation while maintaining small dimensions.

Good results may be obtained if the cup spring is made from copper beryllium, spring bronze (e.g. BZ4a) or spring steel.

Good results may be obtained if the cup spring is retained by a retaining frame arranged at the mounting body as will be shown in more detail below. According to a variation of the invention, the retaining frame is interconnected with the mounting body by means of a snap-connection. Thus, a particularly simple assembly of a connector becomes possible. Other types of interconnections are possible, such as e.g. soldering or friction-type connections. Good results may be obtained if the retaining frame is made from a metal. However, for other applications the retaining frame may also at least partially be made from a plastic, facilitating production significantly. Using a retaining frame also allows an increase in the variety of variations as thus different types of cup springs may be applied using the same type of mounting body and/or retaining frame.

Good results may be obtained if the mounting body comprises a bearing face that is essentially normal to a longitudinal axis of the inner conductor arrangement and wherein the cup spring is attached to the bearing face such that at least a part of it can move relatively to the mounting body.

For some applications, the cup spring may comprise a sleeve that is at least partially arranged in a bore of the mounting body. Thus, the number of components to be assembled can be reduced and hence a particularly simple assembly becomes possible.

A variation of a connector which comprises components that can be produced relatively easily and which is characterized by a particularly good signal transmission can be obtained if the outer conductor arrangement has an essentially circular cross-section. Hence, e.g. at least the connector front end may have an essentially cylindrical shape. Particularly good results may be obtained with a variation of the connector that in general has an essentially cylindrical shape. According to a variation of the invention, the connector may also be angled.

A variation of a coaxial connector which particularly reliable electrical interconnection between the cup spring and the circuit board can be obtained if the cup spring is slotted. According to a variation of the invention at least one slot is open towards the circumference of the cup spring. Thus, resilient fingers can be obtained, as subsequently will be explained. Alternatively or in addition, the cup spring may be slotted, having at least one slot that is open towards the center aperture.

Good results may be obtained if the cup spring comprises multiple slots forming at least one resilient finger (preferably multiple fingers e.g. distributed in circumferential direction) and wherein at least a portion of the contacting zone is arranged at the resilient finger. Thus, certain angular misalignments of the connector with respect to the surface of the circuit board as well as asperity of the circuit board's contact face can be compensated particularly efficiently. This particularly holds true if at least a portion of the contacting zone is arranged in the region of the free end of the resilient finger (respectively the resilient fingers if the cup spring comprises multiple resilient fingers). For certain applications the at least resilient finger may comprise a curved and/or bent free end and wherein at least a portion of the contacting zone is arranged at the free end. Thus, the shape and size area of the contacting zone can be designed in order to obtain a certain mechanical loading on the circuit board and/or certain electrical/electromagnetic coupling. In particular, the resilient fingers may be curved such that the area of surface contact between the cup spring and the circuit board increases with increasing deflection of the resilient fingers (respectively total contact pressure applied to the connector). Thus contact stress can be controlled and consequently mechanical damage to the circuit board be avoided, respectively proper electrical contact be ensured even at low total contact pressure.

According to a variation of the invention that allows relatively easy assembly, the cup spring comprises multiple resilient fingers that are interconnected by a connecting ring. For certain applications, the connecting ring may be a resilient ring.

Good results may be obtained if the contacting zone has an essentially annular shape, as will be shown in more detail below. The annular shape may e.g. be essentially circular or elliptical.

In order to obtain particularly advantageous electrical properties, the contacting zone may follow a closed curve (or path). Thus, good shielding effects may be obtained for certain applications.

Depending on the application and/or type of circuit board, the contacting zone may comprise a recess configured to receive at least one conductive trace of a circuit board when the coaxial connector is interconnected with the circuit board, as will be explained in more detail below. Such a variation with a recess may e.g. be used for printed circuit boards having signal conduction on the same layer.

In a variation of the invention, the contacting zone comprises multiple segments that are separated from each other. As such, the multiple segments may be individual contacting (sub-) zones arranged at resilient fingers as described herein and forming together a total contacting zone. Hence, the contacting zone may be divided in multiple segments by means of slots. Segments may be displaceable essentially independently from each other. Thus, a particularly good compensation of the surface asperity may be obtained. However, the contacting zone may also be a single continuous (or contiguous) area, as will be shown below with respect to the figures.

For some applications, in a non-connected state the inner contacting member may protrude outwards from the center aperture. Thus, a more precise positioning of a connector with respect to a contact point becomes possible. Hence, such a variation of a coaxial connector is highly advantageous when e.g. being used as a probe.

According to a variation of the invention, the contacting tip may be arranged at an inner contacting member that is displaceable with respect to the outer conductor arrangement. Thus, the contact stress applied to the circuit board by means of the inner contacting tip can be controlled, respectively limited, and consequently mechanical damage be avoided and optimal signal transmission be ensured. Good results may be obtained if the inner contacting member is displaceable by means of an inner spring mechanism. The spring characteristics of the inner spring mechanism and the cup spring may be designed to work together in order to obtain proper signal transmission and avoid mechanical damage to the circuit board and/or to the coaxial connector. As well, such an arrangement allows to compensate angular misalignments efficiently.

Good results may be obtained if the coupling axis (or axis of engagement) of the coaxial connector is essentially perpendicular to the contact face of the connector circuit board.

The invention is further directed to a contact arrangement comprising at least one coaxial connector as described herein (respectively a connector assembly as will subsequently be described) and a circuit board that comprises at least one contact face configured to electrically engage with the contacting zone of the at least one coaxial connector and at least on contacting point configured to electrically engage with the contacting tip of the at least one coaxial connector. Thus, a circuit board can easily be contacted without the need of any receiving socket or contacting pin.

The present invention is further directed to providing a connector assembly to electrically interconnect at least one contact point of a circuit board with at least one coaxial electrical cable. Such a connector assembly typically comprises at least one coaxial connector according to the invention as described herein. In addition, the connector assembly comprises at least one coupling means mechanically interconnected with the at least one connecting device and configured to establish a mechanical interconnection with a corresponding coupling port arranged at the circuit board. Thus, a reliable permanent and/or releasable interconnection between one or multiple coaxial cables and a circuit board can be obtained, without the need of modifications to the electrical design. Hence, electrical and mechanical design of the circuit board can be essentially decoupled.

According to a variation of the invention, the connector assembly may a multiple coaxial connectors arranged in a specified pattern relatively to each other.

A very user-friendly variation of a connector assembly may be obtained if the at least one connector is at least partially arranged in a connector housing as will be shown in more detail below. Alternatively or in addition, the coupling means may be at least partially arranged in a (respectively the) connector housing.

For some applications, the coupling means may be configured to obtain a releasable mechanical interconnection between the connector assembly and a circuit board. Particularly good results may be obtained if the interconnection is releasable and re-establishable.

In order to assist in proper positioning of a connector assembly with respect to a circuit board, a connector assembly according to the present invention may comprise a first guiding means that interacts with corresponding second guiding means arranged at the circuit board. Good results may be obtained if the first guiding means comprises a guiding pin and the second guiding means comprises a corresponding bore to receive the guiding pin.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF SEVERAL VIEWS OF THE DRAWINGS

The herein described invention will be more fully understood from the detailed description given herein below and the accompanying drawings which should not be considered limiting to the invention described in the appended claims. The drawings are showing:

DETAILED DESCRIPTION OF THE INVENTION

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

Figure 1:
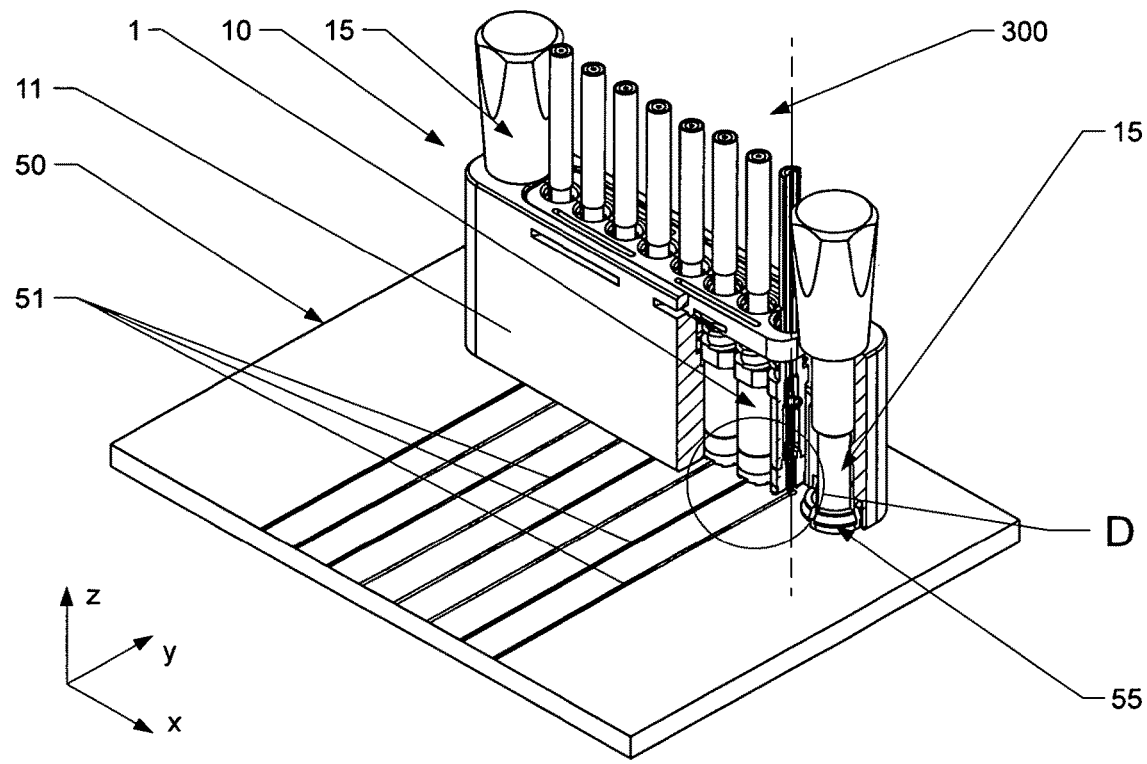
FIG. 1 schematically shows a variation of a connector assembly according to the present invention when connected to a circuit board in a perspective view from above.
Figure 2:
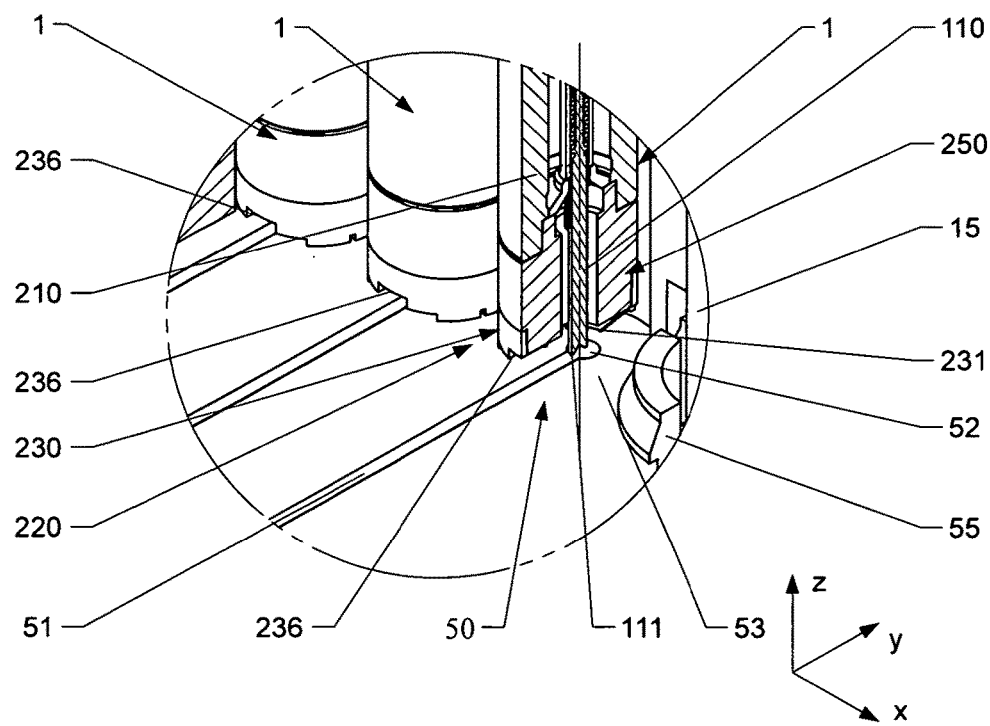
FIG. 2 shows detail D of FIG. 1

FIG. 1 and FIG. 2 depict a variation of a connector assembly 10 according to the present invention that is interconnected to a circuit board 50 in order to establish electrical contact between a series of coaxial cables 300 and several corresponding contacting points 52 of conductive traces 51 arranged on the circuit board 50, as shown in more detail in FIG. 2. The connector assembly 10 comprises eight coaxial connectors 1 which are arranged in a specific pattern to be aligned with corresponding contacting points 52 on the circuit board 50. The coaxial connectors 1 are arranged in a connector housing 11 which ensures correct alignment of the coaxial connectors 1 as well as facilitates operation of the connector assembly 1/0. The connector assembly 10 further comprises a coupling means 15 that is partially arranged in the connector housing 11 and in the variation shown comprises a threaded part (not visible) configured to establish a mechanical interconnection with a corresponding threaded coupling port 55 arranged at the circuit board. Thus, the connector assembly 10 can be releasably interconnected with the circuit board 50. As well, the coupling means 15 and the coupling port 55 help to align, respectively position, the coaxial connectors 1 and the contacting points 52 relatively to each other. In the variation shown, the coupling ports 55 are essentially threaded and slotted sleeves that can be easily snapped in openings (bores) arranged in the circuit board 50.

Figure 3:
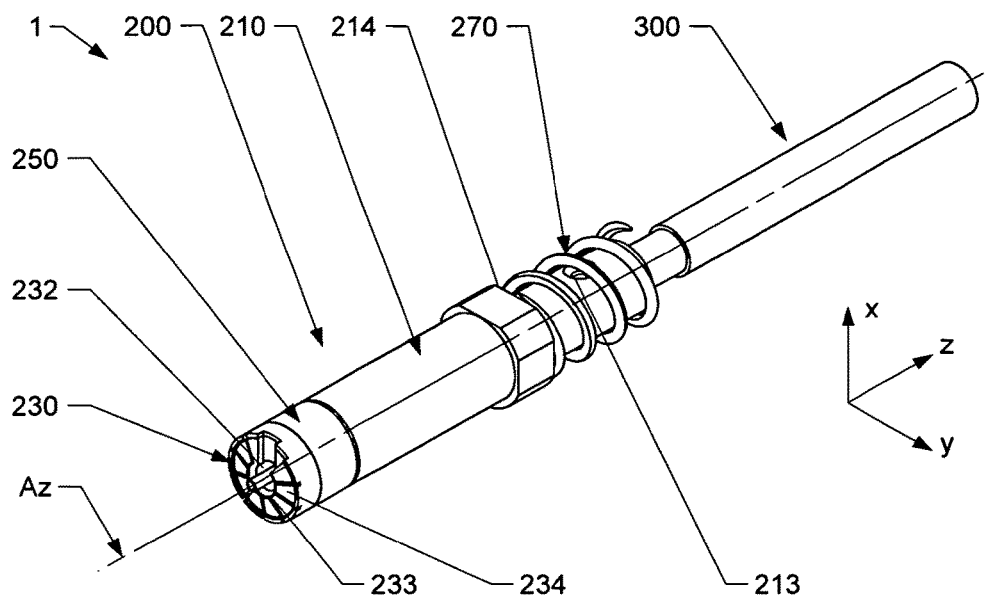
FIG. 3 schematically shows a variation of a coaxial connector according to the present invention in a perspective view.
Figure 4:
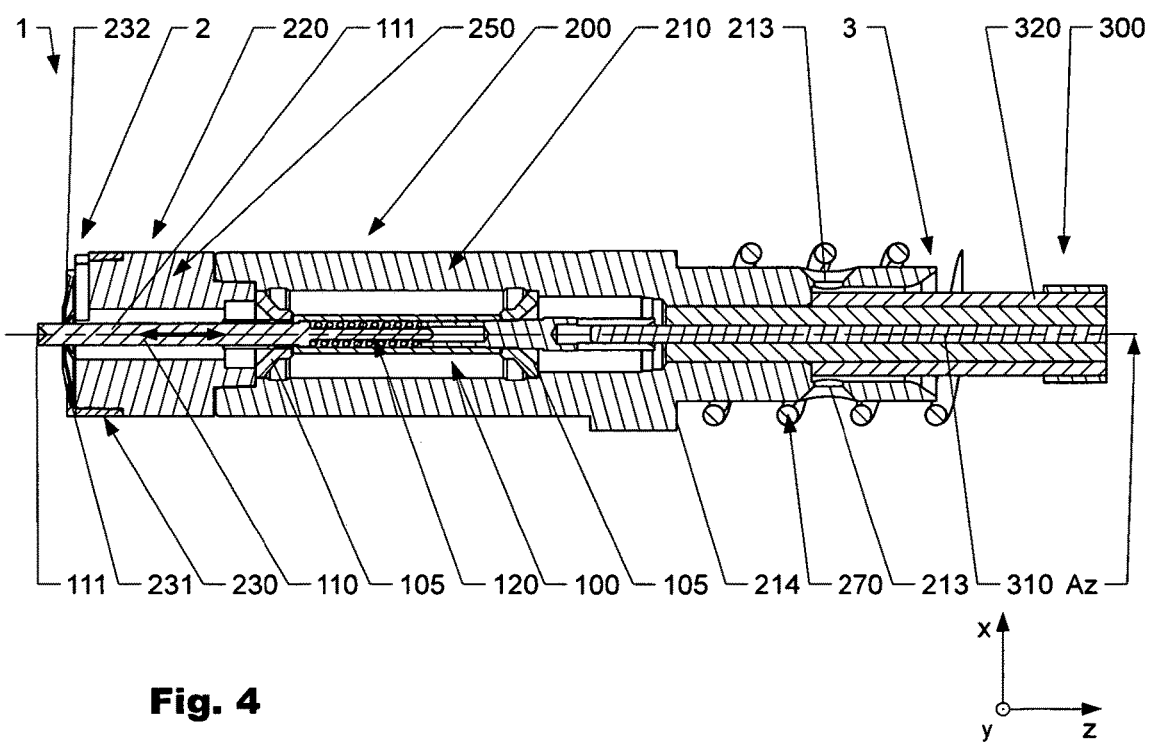
FIG. 4 shows a longitudinal cross-section of the a coaxial connector of FIG. 3.
Figure 5:
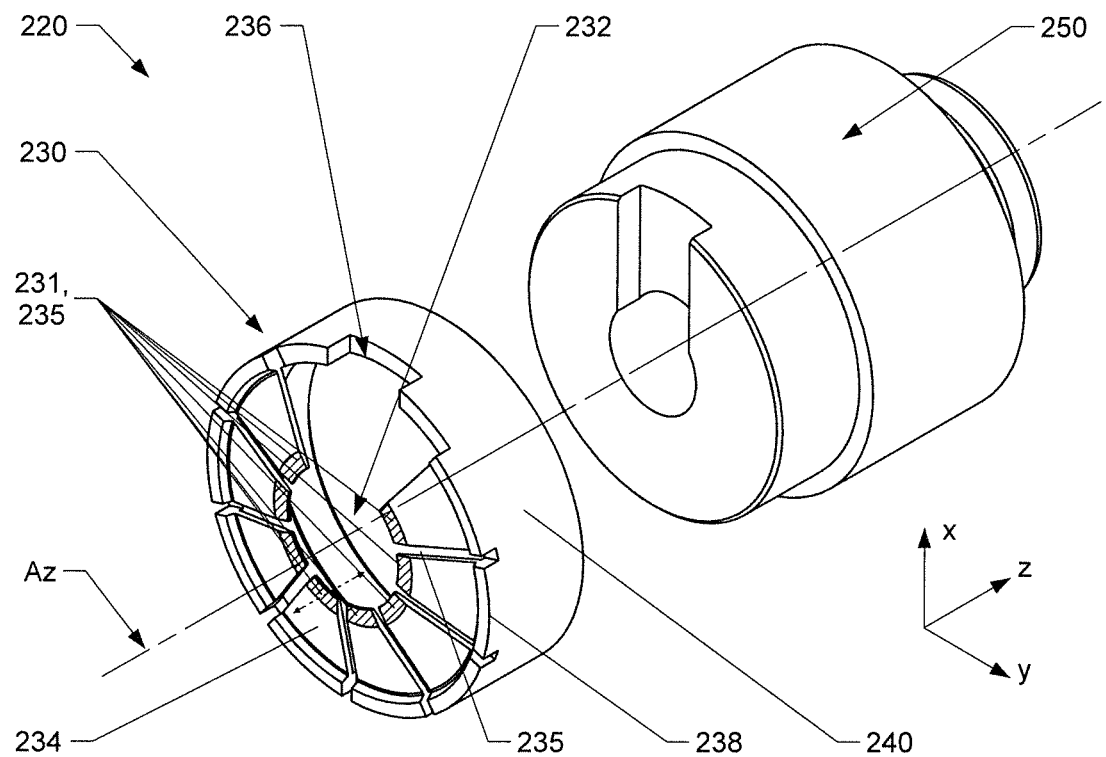
FIG. 5 shows the compensator means of the coaxial connector of FIGS. 3 and 4 in a perspective view.

The variation of a coaxial connector 1 as illustrated in FIG. 1 and FIG. 2 and shown in more detail in subsequent FIG. 3 to FIG. 5, allows to obtain a high quality electrical interconnection between a contacting point 52 and a contacting tip 111 arranged at an inner contacting member 110 of an inner conductor arrangement 100 that is interconnected with the inner conductor 310 of an associated coaxial cable 300. As schematically shown in FIG. 4, the inner conductor arrangement 100 is at a connector rear end 3 (respectively cable entry end) interconnected with the inner conductor 310 of a coaxial cable 300 by means of a solder connection. The inner conductor arrangement 100 is held by means of an inner bearing 105 such that no electrical contact with an outer conductor arrangement 200 is established. The inner conductor arrangement 100 comprises an inner contacting member 110 that in the region of the connector front end 2 has a contacting tip 111 arranged to establish an electrical interconnection with a contacting point 52 of a circuit board 50. The inner conductor arrangement 100 further comprises an inner spring arrangement 120 which allows the inner contacting member 110 to move relatively to the outer conductor arrangement 200 along a longitudinal axis Az of the coaxial connector 1, as indicated by the bold double arrow.

As depicted in FIG. 2 to FIG. 5, the embodiment of a coaxial connector 1 according to the invention shown comprises an outer conductor arrangement 200 that can be interconnected with an outer conductor 320 of a coaxial cable 300 at a connector rear end 3. Therefore, the connector comprises a outer conductor member 210 which has a in the region of the connector rear end 3 soldering openings 213 which can be used to establish a solder connection (not shown) with the outer conductor of the coaxial cable. The outer conductor member shown further comprises an outer shoulder 214 at which an outer spring element 270 can be arranged. The outer spring element 270 can be used in order to allow certain displacements of a coaxial connector 1 relatively to a connector housing 11, as illustrated in FIG. 1.

The coaxial connector 1 shown further comprises a compensator means 220 that is arranged at the connector front end 2 and comprises an electrically conductive mounting body 250 that that is mechanically and electrically interconnected with the outer conductor member 210. At the frontal side of the mounting body 250 a cup spring 230 is attached, which comprises a contacting zone 231 configured to contact a contact face 53 of a circuit board 50, as illustrated in FIG. 2. Thus, an electrical interconnection between the outer conductor arrangement 200 and the contact face 53 can be established. The cup spring 230 has a center aperture 232 as shown e.g. in FIG. 5. Said center aperture 232 is partially encircled by the contacting zone 231. The contacting zone 231 of the variation shown in FIG. 1 to 5 is divided into multiple segments by means of slots 235, the segments forming sub-zones of the contacting zone 231. The segments are arranged such that they essentially follow a circular path/curve, forming an (open) annular contacting zone (231). As already mentioned, the variation of a coaxial connector 1 as illustrated in FIG. 1 to FIG. 5 comprises a cup spring that the cup spring 230 that is slotted, respectively comprises multiple slots 235 which form resilient fingers 234 that can be deflected essentially in parallel to a longitudinal axis Az of the coaxial connector 1 as schematically indicated by the dotted arrow in FIG. 5. As shown, the slots 235 are open towards the center aperture 232 of the cup spring 230 and the contacting zone 231 is arranged at the free end of the resilient fingers 234. The resilient fingers 234 are mechanically interconnected by means of a connecting ring 240 which is also used in order to mechanically interconnect the cup spring 230 with the mounting body 250 e.g. by means of a positive or non-positive connection or a solder connection (not shown).

The cup spring 230 further comprises a recess 236 that is configured to receive a conductive trace 51 as illustrated in FIG. 2. Thus, a contacting point 52 being part of a conductive trace 51 can be contacted by means of the inner contacting tip 111 without interfering with the outer conductor arrangement 200, while still sufficient electromagnetic shielding is provided.

The contacting tip 111 of the inner conductor arrangement 100 of the variation of a coaxial connector 1 shown in FIG. 1 to FIG. 5 is configured such that it can contact a contacting point 52 of a circuit board 50 via the center aperture 232 of the compensator means 230 in order to establish an electrical contact between the inner conductor 100 and the contacting point 52, as illustrated e.g. in FIG. 2. As illustrated in FIG. 4, in the variation of a coaxial connector 1 shown, in a non-connected state the inner contacting member 110 protrudes outwards from the center aperture 232. This facilitates positioning of the coaxial connector 1 with respect to a contacting point of a circuit board 50. However, for certain applications a variation of a coaxial connector 1 according to the present invention may also comprise an inner contacting member 110 which in a non-connected state does not protrude from the center opening 234.

Figure 6:
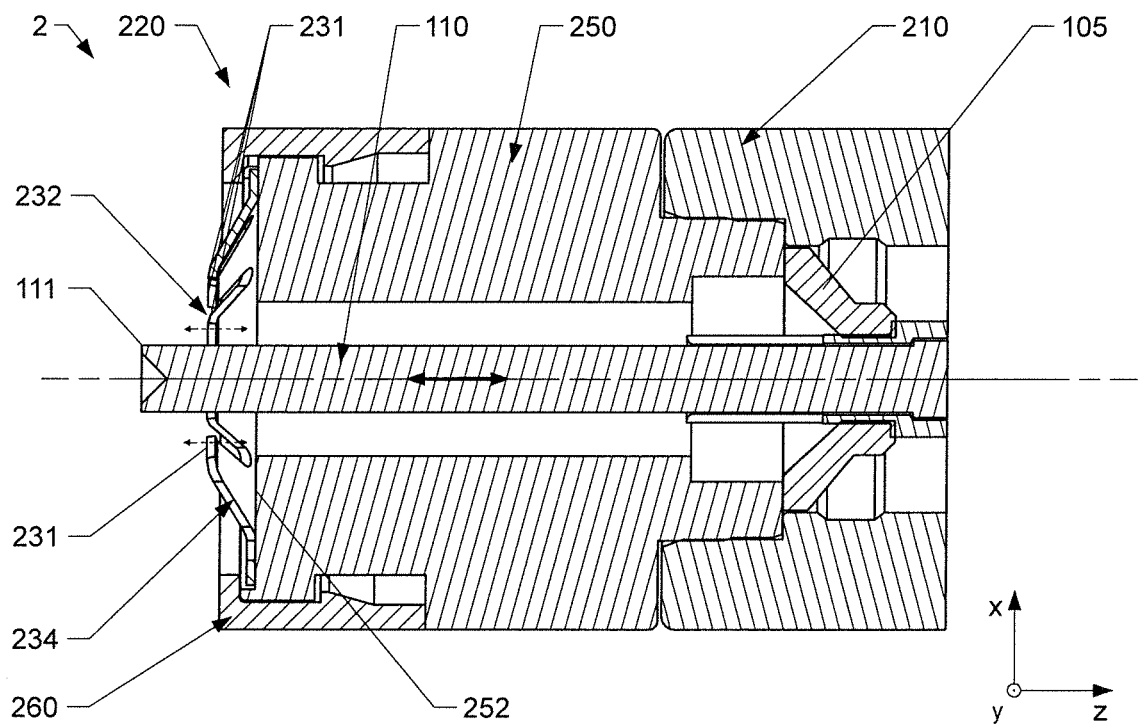
FIG. 6 schematically shows a longitudinal cross-section of the front end of another variation of a coaxial connector according to the present invention having another type of compensator means.
Figure 7:
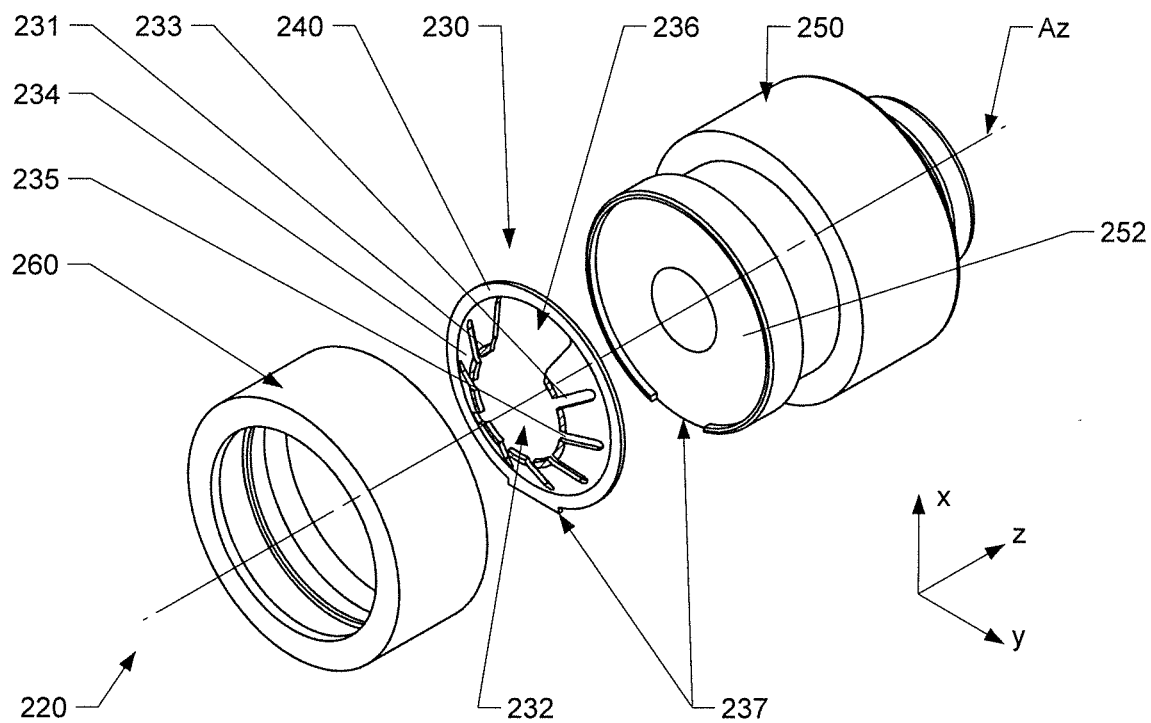
FIG. 7 schematically shows the compensator means of FIG. 6 in a disassembled state.

FIG. 6 and FIG. 7 illustrate another variation of compensator means 220 where the cup spring 230 is also slotted, having slots 235 that are open towards the center aperture 232, forming resilient fingers 235 at which a segmented contacting zone 231 is arranged. The variation of a compensator means 220 shown in these figures comprises a retaining frame 260 that can be attached to a mounting body 250 in order to retain the cup spring 230 by a positive locking. In the embodiment 220 shown, the cup spring 230 comprises a connecting ring that is designed such that minor displacements of the cup spring 120 in a plane (x/y-plane) perpendicular to the longitudinal axis Az become possible, as well as twisting of the connecting ring 240. Therefore the mounting body 250 comprises a bearing face 252 that is essentially normal to a longitudinal axis Az of the inner conductor arrangement 100 and the cup spring 230 is attached to the bearing face 252 by the retaining frame 260. Hence, a compensator means 220 that has advantageous mechanical properties for certain applications can be obtained. The retaining frame 260 of the variation shown can be mechanically interconnected with the mounting body by means of a snap-connection, as illustrated in FIG. 6. Thus, assembly of the coaxial connector 1 can be significantly facilitated. As also shown, the variation of a compensator means 220 as shown in FIG. 6 and FIG. 7 comprises a rotation lock 237 which prevents relative rotations between the cup spring 230 and the mounting body 250 about the longitudinal axis Az and hence ensures that the recess 236 is always arranged at the specified location which is important in order to prevent unwanted electrical contact between the outer conductor and a conductive trace of a circuit board. Such a rotation lock may also be applied in all variations of a coaxial connector 1 according to the present invention, hence is not limited to variations having a retaining frame 260.

Figure 8:
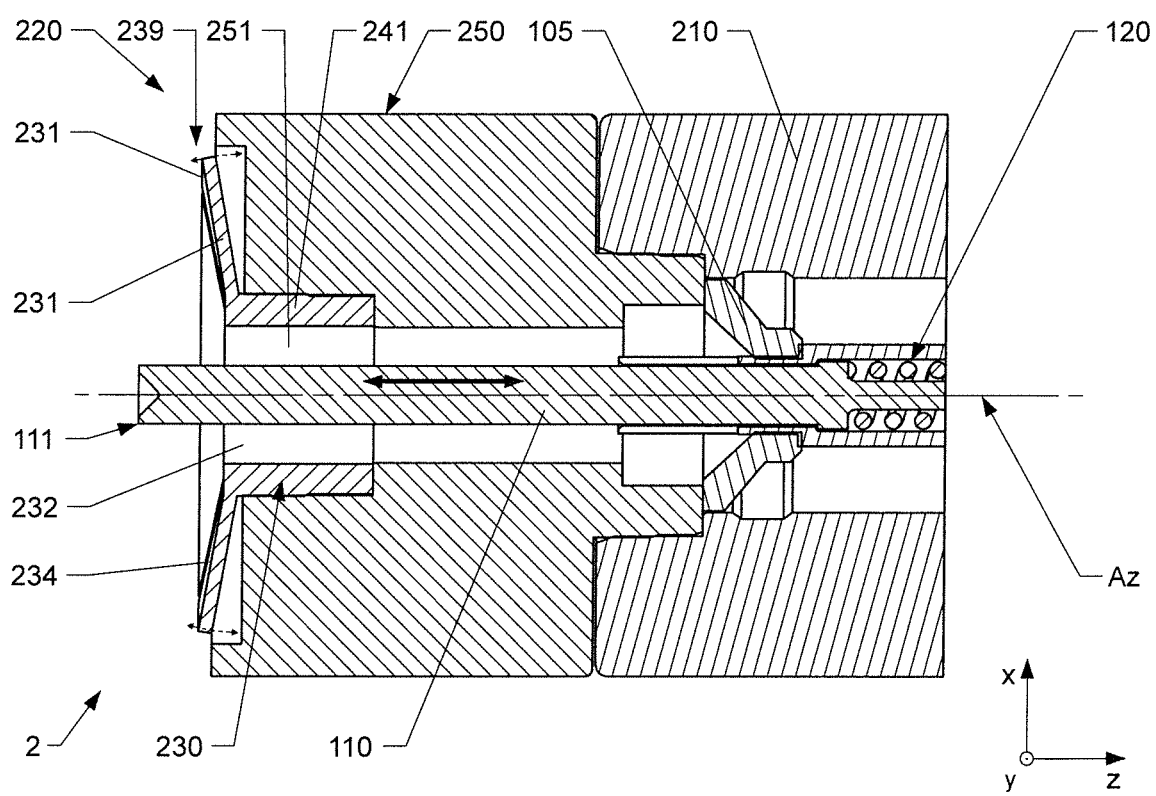
FIG. 8 schematically shows a longitudinal cross-section of the front end of another variation of a coaxial connector according to the present invention having another type of compensator means.
Figure 9:
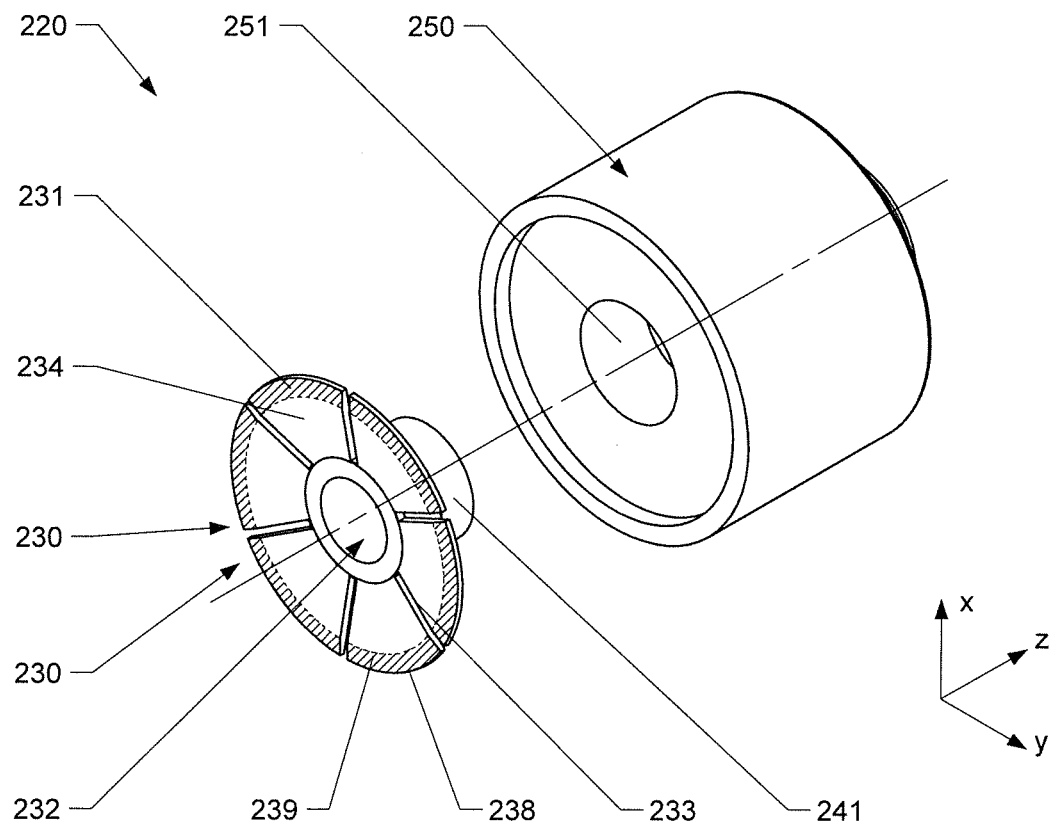
FIG. 9 schematically shows the compensator means of FIG. 8 in a disassembled state.

FIG. 8 and FIG. 9 depict another variation of a compensator means 230 for a coaxial connector 1 according to the present invention. The embodiment shown comprises a sleeve 241 that is partially arranged in a bore 251 of a mounting body 250. The cup spring 230 is slotted, having multiple slots 233 which are open towards the circumference 238 of the cup spring 230. A segmented connecting zone 231 is arranged at the free ends 239 of resilient fingers 235 formed by the slots 233 A coaxial connector 1 comprising such a variation of a compensator means variation of the invention allows easy assembly of the compensator means 220.

Figure 10:
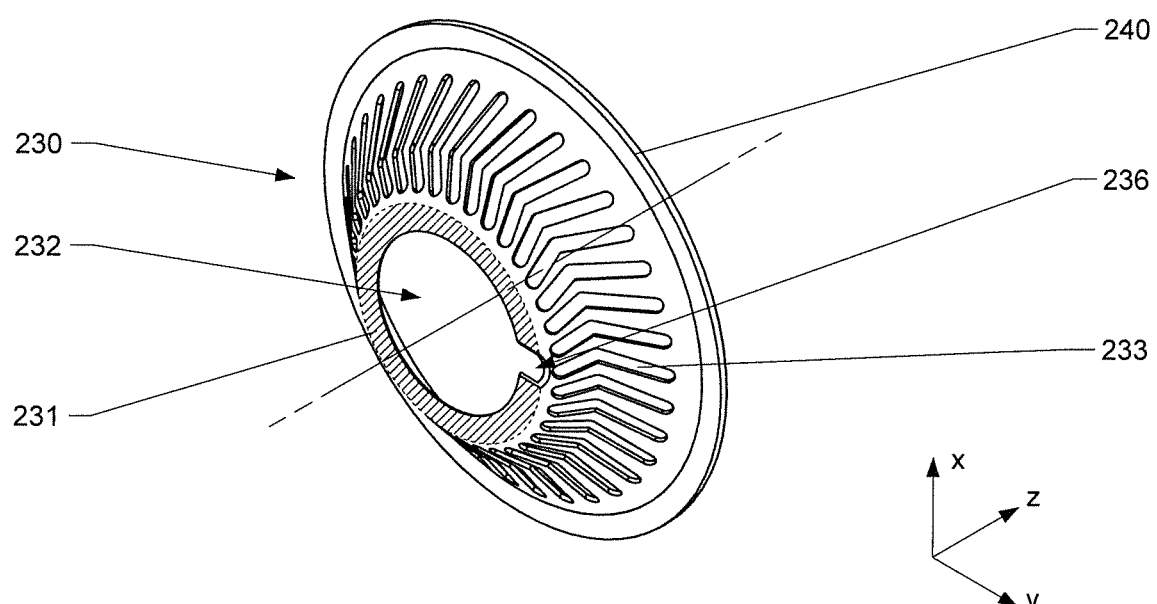
FIG. 10 schematically shows a variation of a cup spring for a coaxial connector according to the present invention in a perspective view.

FIG. 10 schematically shows another variation of a cup spring 230 that may be used for certain variations of a coaxial connector 1 according to the present invention. The cup spring 230 has an essentially frustoconical shape and comprises multiple curved slots 233 arranged circumferentially distributed around the shell surface. In contrast to the variations shown in FIG. 1 to FIG. 9, this embodiment of a cup spring 230 has a continuous contacting zone 231, respectively is not segmented. Such a design is advantageous for the transmission of certain signals. In order to compensate asperity of a circuit board, the wall thickness of the cup spring 230 at the contacting zone 231 is decreased.

Rather, the words used in the specification are words of description rather than limitation, and it is understood that various changes may be made without departing from the spirit and scope of the invention.

We claim:

1. A coaxial connector (1) for electrically interconnecting a coaxial cable (300) with a circuit board (50), the coaxial connector (1) comprising a connector front end (2) connectable with a circuit board (50) and a connector rear end (3) connectable with the coaxial cable (300), the coaxial connector (1) comprising:
   a. an outer conductor arrangement (200) connectable with an outer conductor (320) of the coaxial cable (300) at the connector rear end (3), having
      i. a compensator means (220) arranged at the connector front end (2) comprising
         1. at least one cup spring (230) including a contacting zone (231) configured to contact a contact face (53) of the circuit board (50) to establish an electrical interconnection between the outer conductor arrangement (200) and the contact face (53) and
         2. the cup spring (230) including a center aperture (232) that is at least partially encircled by the contacting zone (231); and
   b. an inner conductor arrangement (100) connectable with an inner conductor (310) of the coaxial cable (300) at the connector rear end (3), having
      i. a contacting tip (111) configured to contact a contacting point (52) of the circuit board (50) via the center aperture (232) of the compensator means (230) to establish an electrical contact between the inner conductor (100) and the contacting point (52).

2. The coaxial connector (1) according to claim 1, wherein the cup spring (230) is configured such that the contacting zone (231) can be deflected in a direction essentially perpendicular to the contact face (53) of the circuit board (50) when the contact face (53) of the circuit board (50) is contacted.

3. The coaxial connector (1) according to claim 2, wherein the cup spring (230) is attached to, and electrically interconnected with, a mounting body (250) arranged at the connector front end (2).

4. The coaxial connector (1) according to claim 3, wherein the cup spring (230) is retained by a retaining frame (260) arranged at the mounting body (250).

5. The coaxial connector (1) according to claim 4, wherein the mounting body (250) comprises a bearing face (252) that is essentially normal to a longitudinal axis (Az) of the inner conductor arrangement (100) and wherein the cup spring (230) is attached to the bearing face (252) such that at least a part of it can move relatively to the mounting body (250).

6. The coaxial connector (1) according to claim 3, wherein the cup spring (230) comprises a sleeve (241) that is at least partially arranged in a bore (251) of the mounting body (250).

7. The coaxial connector (1) according to claim 1, wherein outer conductor arrangement (200) comprises an essentially circular cross-section.

8. The coaxial connector (1) according to claim 1, wherein the cup spring (230) is slotted, having at least one slot (233) that is open towards the circumference (238) of the cup spring (230).

9. The coaxial connector (1) according to claim 1, wherein the cup spring (230) is slotted, having at least one slot (233) that is open towards the center aperture (232).

10. The coaxial connector (1) according to claim 1, wherein the cup spring (230) comprises multiple slots (233) forming at least one resilient finger (234) and wherein at least a portion of the contacting zone (231) is arranged at the resilient finger (234).

11. The coaxial connector (1) according to claim 10, wherein the at least resilient finger (234) comprises a curved and/or bent free end (241) and wherein at least a portion of the contacting zone (231) is arranged at the free end (241).

12. The coaxial connector (1) according to claim 1, wherein the contacting zone (231) has an essentially annular shape.

13. The coaxial connector (1) according to claim 1, wherein the contacting zone (231) follows a closed curve.

14. The coaxial connector (1) according to claim 1, wherein the contacting zone (231) comprises a recess (236) configured to receive at least one conductive trace (51) of the circuit board (50).

15. The coaxial connector (1) according to claim 1, wherein the contacting zone (232) comprises multiple segments (235) separated from each other.

16. The coaxial connector (1) according to claim 1, wherein in a non-connected state the inner contacting member (110) protrudes outwards from the center aperture (232).

17. The coaxial connector (1) according to claim 1, wherein the contacting tip (111) is arranged at an inner contacting member (110) that is displaceable with respect to the outer conductor arrangement (200).

18. A contact arrangement (500) comprising:
  a. at least one coaxial connector (1) according to claim 1 and
  b. a circuit board (50) comprising
    i. at least one contact face (53) configured to electrically engage with the contacting zone (231) of the at least one coaxial connector (1) and
    ii. at least on contacting point (52) configured to electrically engage with the contacting tip (111) of the at least one coaxial connector (1).

19. A connector assembly (10) to electrically interconnect at least one contact point (52) of a circuit board (50) with at least one coaxial electrical cable (300), comprising:
  a. at least one coaxial connector (1) according to claim 1;
  b. at least one coupling means (15) mechanically interconnected with the at least one connecting device (1) and
    i. configured to establish a mechanical interconnection with a corresponding coupling port (55) arranged at the circuit board (50).

20. The connector assembly (10) according to claim 19, wherein the connector assembly (10) comprises multiple coaxial connectors (1) arranged in a specified pattern relatively to each other.

21. The connector assembly (10) according to claim 19, wherein at least one coaxial connector (1) is at least partially arranged in a connector housing (11).

22. The connector assembly (10) according to claim 21, wherein the coupling means (15) is at least partially arranged in the connector housing (11).

23. The connector assembly (10) according to claim 19, wherein the coupling means (15) is configured to obtain a releasable mechanical interconnection between the connector assembly (10) and a circuit board (50).

* * * * *